(12) United States Patent
Lakhera et al.

(10) Patent No.: US 10,211,184 B2
(45) Date of Patent: Feb. 19, 2019

(54) APPARATUS AND METHODS FOR MULTI-DIE PACKAGING

(71) Applicant: NXP USA, Inc., Austin, TX (US)

(72) Inventors: Nishant Lakhera, Austin, TX (US); Navas Khan Oratti Kalandar, Austin, TX (US); Akhilesh K. Singh, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/802,943

(22) Filed: Nov. 3, 2017

(65) Prior Publication Data

US 2018/0053749 A1 Feb. 22, 2018

Related U.S. Application Data

(62) Division of application No. 15/080,162, filed on Mar. 24, 2016, now abandoned.

(51) Int. Cl.
*H01L 21/56* (2006.01)
*H01L 21/48* (2006.01)
(Continued)

(52) U.S. Cl.
CPC ...... *H01L 25/0657* (2013.01); *H01L 21/4825* (2013.01); *H01L 21/565* (2013.01); *H01L 23/3114* (2013.01); *H01L 23/4952* (2013.01); *H01L 23/49503* (2013.01); *H01L 23/49575* (2013.01); *H01L 25/105* (2013.01); *H01L 25/50* (2013.01); *H01L 21/561* (2013.01); *H01L 23/3107* (2013.01); *H01L 2224/16245* (2013.01); *H01L 2224/48091* (2013.01); *H01L 2224/48247* (2013.01); *H01L 2224/48465* (2013.01); *H01L 2224/73265* (2013.01); *H01L 2225/0651* (2013.01); *H01L 2225/06558* (2013.01); *H01L 2225/06582* (2013.01); *H01L 2225/1029* (2013.01); *H01L 2225/1058* (2013.01)

(58) Field of Classification Search
CPC . H01L 21/4825; H01L 21/565; H01L 25/043; H01L 25/0652; H01L 25/0657; H01L 25/0756
See application file for complete search history.

(56) References Cited

U.S. PATENT DOCUMENTS 7,969,018 B2 * 6/2011 Otremba ............... H01L 21/561
257/686
8,053,883 B2 * 11/2011 Galera ............... H01L 23/4951
257/686
(Continued)

*Primary Examiner* — Phat X Cao

(57) ABSTRACT

A packaged semiconductor device includes a first package substrate having a first plurality of lead fingers, a first die attached to a first major surface of the first package substrate, a second package substrate having a second plurality of lead fingers, wherein each of the second plurality of lead fingers extends over the first die and the second package substrate is electrically isolated from the first package substrate. The device also includes a second die attached to a first major surface of the second package substrate, over the first die, and an encapsulant surrounding the first die, the first package substrate, the second die, and the second package substrate, wherein the encapsulant exposes a portion of the first package substrate and a portion of the second package substrate.

20 Claims, 10 Drawing Sheets

(51) Int. Cl.
*H01L 25/065* (2006.01)
*H01L 23/495* (2006.01)
*H01L 25/10* (2006.01)
*H01L 23/31* (2006.01)
*H01L 25/00* (2006.01)

(56) References Cited

U.S. PATENT DOCUMENTS

2007/0210424 A1* 9/2007 Ho ......................... H01L 25/105
 257/678
2007/0210443 A1* 9/2007 Merilo ................. H01L 23/3128
 257/704
2008/0171405 A1* 7/2008 Yee ........................ H01L 21/568
 438/109

* cited by examiner

APPARATUS AND METHODS FOR MULTI-DIE PACKAGING

BACKGROUND

Field

This disclosure relates generally to semiconductor device packaging, and more specifically, to packages with multiple semiconductor die.

Related Art

Package substrates for semiconductor devices such as leadframes and ceramic or laminate substrates provide a central supporting structure of molded IC packages to which all other elements of the molded IC package are attached. Package substrates are etched, stamped or formed with a thin sheet of material with a pattern of terminals around a central die attach platform upon which a die is mounted using, for example, an epoxy resin. The die includes bonding pads which are electrically connected to the surrounding lead terminals of the frame by conductive wires using well-established wirebond techniques. The assembly including the package substrate, die, and wires are covered with encapsulant material to complete the molded IC package.

The demand for smaller devices with higher throughput and capability is ever increasing. Thus, there is a continuing need to find ways to fit more semiconductor processing, memory, and/or sensor devices in the smallest space possible.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Apparatus and methods disclosed herein provide a packaged semiconductor assembly with two or more die on tiered package substrates. One tier includes a first package substrate with one or more die mounted thereon. Another tier includes a second package substrate with one or more die mounted thereon that is stacked over the first package substrate. The second package substrate can be pre-formed with a recessed or downset flag portion that provides clearance between the die and wirebonds on the first and second package substrates when the second package substrate is placed upside-down over the first package substrate. The die on the first package substrate face the die on the second package substrate. Encapsulating material is formed around both package substrates to protect the die and wirebonds. Contact pads for both package substrates can be accessed on one side of the packaged semiconductor assembly. Another packaged semiconductor device can be mounted to contact pads on another side of the packaged semiconductor assembly, thereby further increasing the number of integrated circuit devices and sensors that can be located within the same footprint.

Figure 1:
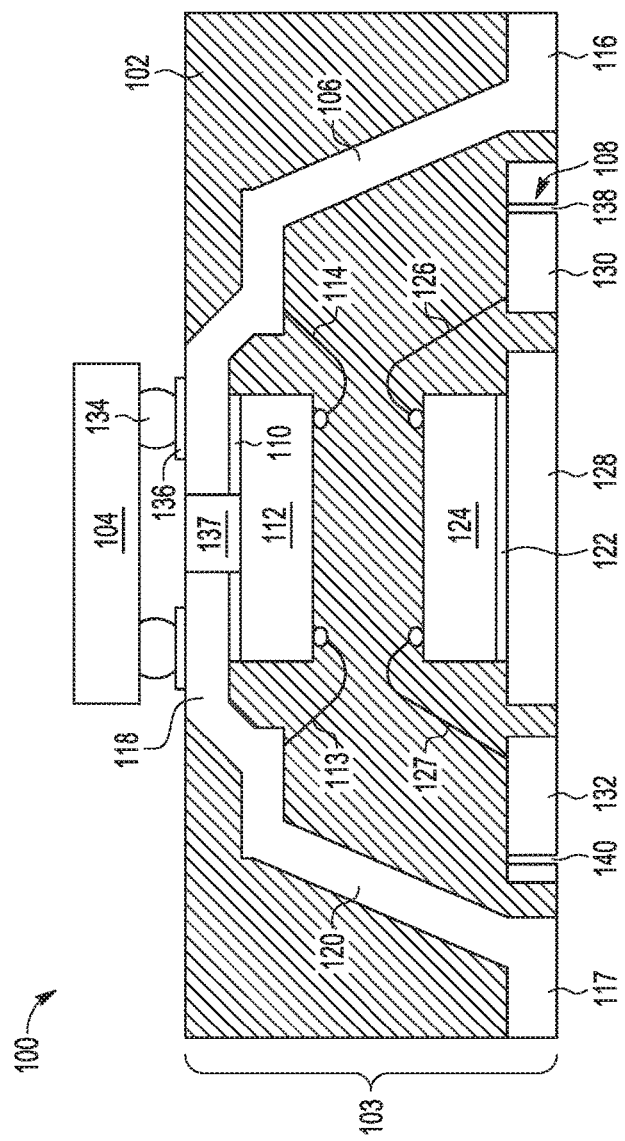
FIG. 1 shows a side cross-sectional view of an embodiment of a packaged semiconductor assembly with multiple die.

Referring now to FIG. 1, a cross-sectional side view of an embodiment of tiered semiconductor devices 100 including packaged semiconductor assembly 103 that includes encapsulant 102 around a first package substrate 106 and a second package substrate 108. Internal to assembly 103, die attach material 110 is used to attached die 112 to recessed or downset flag portion 118 of first package substrate 106. A separate packaged device 104 is mounted with solder balls 134 coupled to conductive material 136 on assembly 103. Packaged device 104 may include circuitry for any suitable or desired functionality such as a system on a chip with a processor, memory device and sensor, or a standalone processor, memory device, or sensor, or any combination thereof.

In assembly 103, package substrate 106 may be a pre-formed leadframe that is stamped and/or etched from metal or other suitable material. Other suitable structures can be used for package substrate, however. Wirebonds 113, 114 are formed between die 112 and conductive pads or contact pads 116, 117 of package substrate 106 to form electrical connections between die 112 and contact pads 116, 117. Conductive pads 116, 117 of package substrate are exposed through encapsulant 102 on one side of assembly 103 to allow assembly 103 to be electrically coupled or connected to a larger assembly of components on a printed circuit board or other structure (not shown). Conductive pads 116, 117 are separated from flag portion 118 by lead fingers 120 that extend between conductive pads 116, 117 and flag portion 118. The length of lead fingers 120 is sufficient to provide clearance between die 112 and wirebonds 113, 114 on first package substrate 106 and die 124 and wirebonds 126, 127 on second package substrate 108. In the embodiment shown, lead fingers 120 are at an angle between conductive pads 116, 117 and flag portion 118. The angle of lead fingers 120 can be selected to provide sufficient space for second package substrate 108 between conductive pads 116, 117.

Die 112 may be configured as a sensor, such as a pressure sensor. Accordingly, flag portion 118 can include an opening to allow ambient pressure to deflect a diaphragm (not shown) on a surface of die 112. The deflection can be detected by circuitry in die 112, and a signal to proportional to the pressure can be provided by die 112. In other embodiments, die 112 may have functionality other than a pressure sensor that does not require flag portion 118 to include an opening. In such cases, the opening may be filled with encapsulating material or other insulating material to prevent unintentional electrical contact with lead fingers 120 and protect lead fingers 120 from corrosive environments.

In the embodiment shown package substrate 108 is a quad flat no lead (QFN) leadframe with semiconductor die 124 mounted on die attach area (also referred to as "die flags") 128 with die attach material 122. Contacts 130, 132 are spaced from peripheral edges of die flag 128. Wirebonds 126, 127 are formed between a contact on a surface of die 124 and respective contacts 130, 132 on leadframe 108 Die flag 128 is sized and shaped to receive one or more integrated circuit (IC) dies or other components. Die 124 may include any type of integrated circuitry that performs any suitable type of function such a System on a Chip, microprocessor, memory, sensor, or other suitable circuitry. Die attach material 122, 110 may be any suitable material such as epoxy, tape, solder, or other suitable material.

In addition to being connected to die 124, contacts 130, 132 can be connected to contacts or leads on other components during later stages of assembly to allow the components in device 100 to operate with devices and/or components in other packages mounted on a printed circuit board or other structure.

Note that although package substrates 106, 108 are shown with one die flag 118, 128 in FIG. 1, package substrates 106, 108 can include any suitable number of die flags 118, 128 and can be arranged with a two dimensional matrix of die flags 118, 128. Further, although package substrate 108 is shown as a QFN leadframe, package substrate 108 can be any suitable type of substrate for mounting a packaged IC device.

Figure 2:
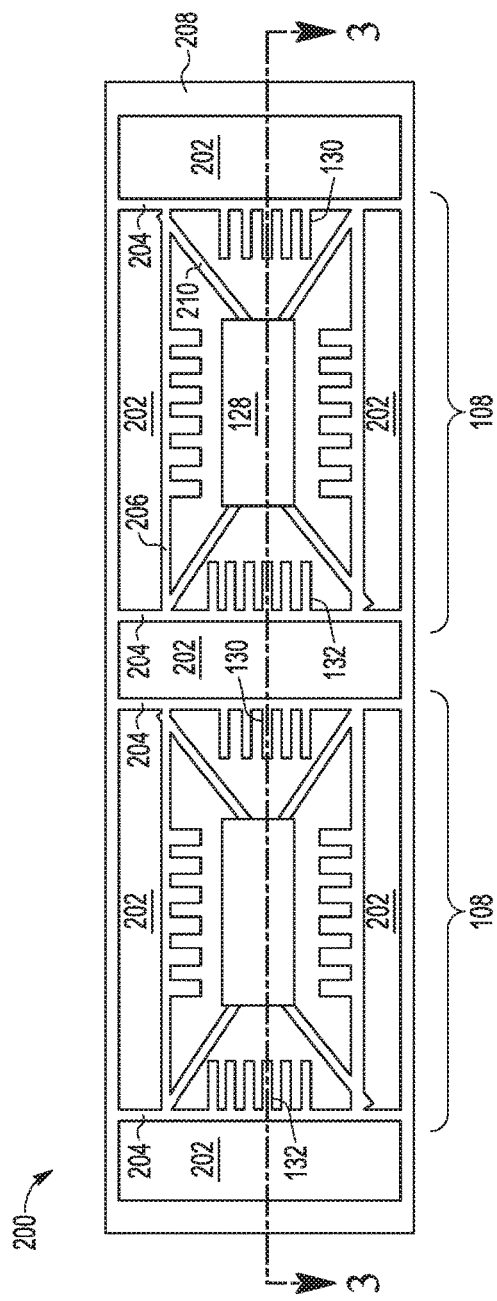
FIG. 2 shows a top view of an embodiment of a first package substrate that may be used in the packaged semiconductor assembly of FIG. 1.

FIG. 2 shows a top view of an embodiment of a leadframe strip 200 including two package substrates 108 connected to one another that may be used to manufacture the packaged semiconductor assembly 103 of FIG. 1. Note that leadframe strip 200 can include additional package substrates 108 arranged in strip 200, or as a two dimensional array with two or more package substrates 108 in each row and column. Each package substrate 108 is square or rectangular with contacts 130, 132 spaced from each around the periphery of flag 128. Contacts 130, 132 are spaced around the periphery of flag 128 and held separated from one another and from flag 128 with one end of each contact 130, 132 connected to a respective one of vertical tie bars 204 and horizontal tie bars 206. Each of four corners of die flag 128 is coupled to one end of tie bars 210. Another end of tie bars 210 is coupled at an angle to a point where tie bars 206 are coupled to tie bars 204. Tie bars 204, 206 are in turn coupled to frame 208. Slots or openings 202 are positioned between vertical tie bars 204 to accommodate contacts 117, 116 of package substrate 106 (not shown) at a subsequent stage of manufacture.

Figure 3:
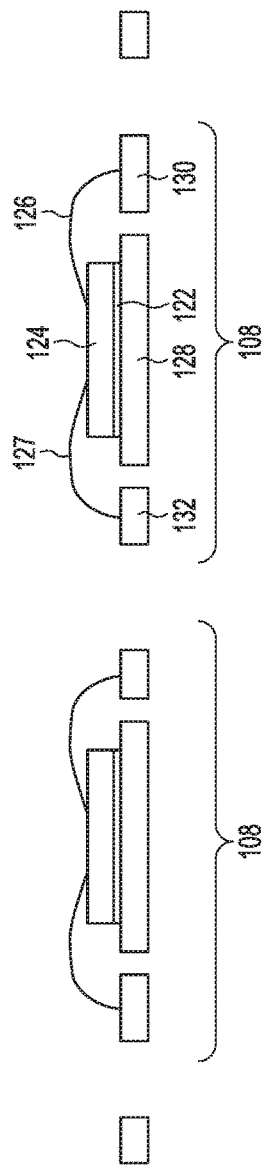
FIG. 3 shows a side cross-sectional view of an embodiment of the first package substrate of FIG. 2 at a subsequent stage of assembly.

FIG. 3 shows a side cross-sectional view of an embodiment of package substrate 108 of FIG. 2 at a subsequent stage of assembly in which die 124 is mounted to flag portion 128 by die attach material 122. Wirebonds 126, 127 are formed between respective contacts (not shown) on die 124 and contacts 130, 132 on package substrate 108.

Figure 4:
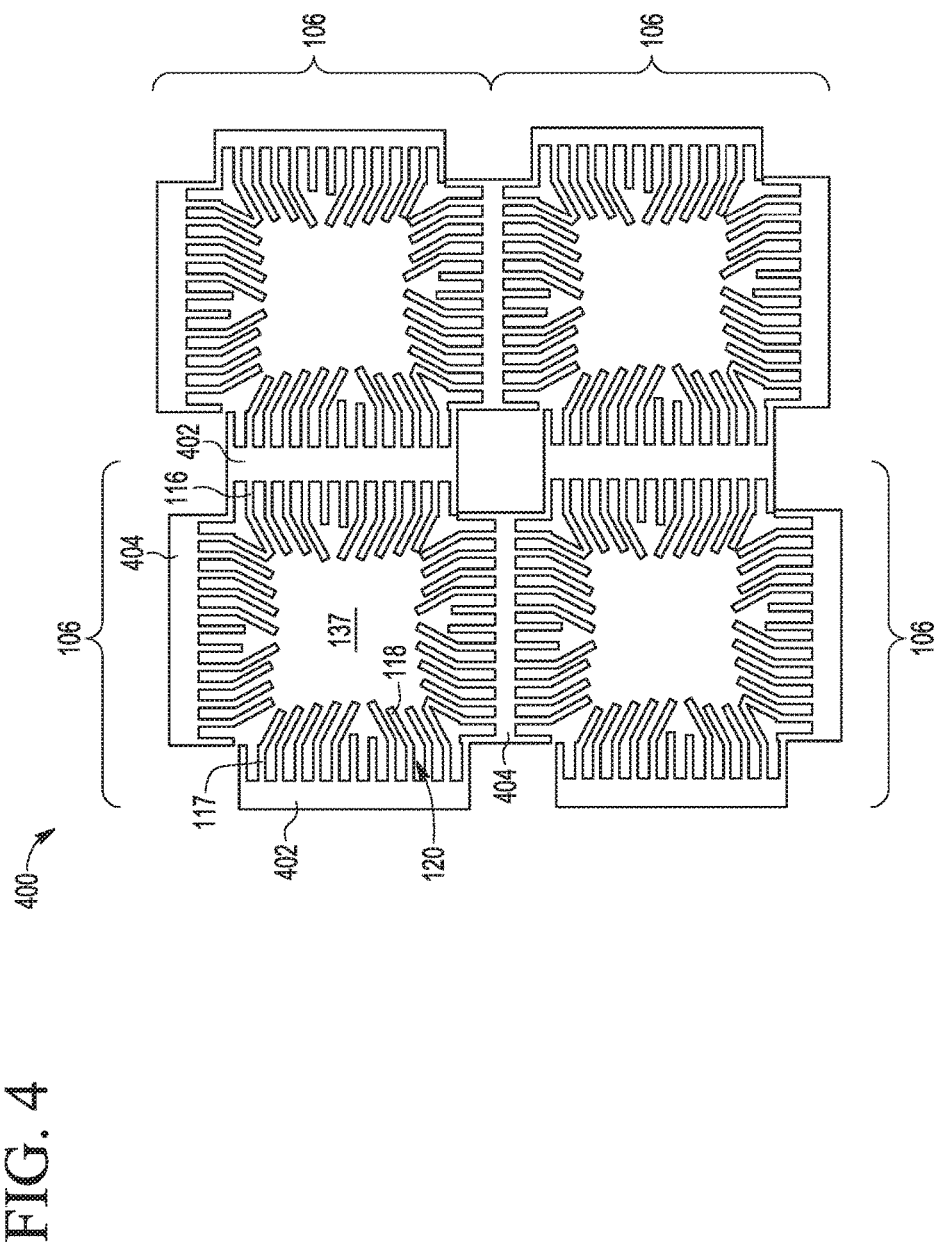
FIG. 4 shows a top view of an embodiment of a second package substrate that may be used in the packaged semiconductor assembly of FIG. 1.

Components can be assembled on substrate 106 before, after, or contemporaneously with the components being assembled on package substrate 108. FIG. 4 shows a top view of an embodiment of an array of package substrates 106 that may be used in the packaged semiconductor assembly 103 of FIG. 1. Although four package substrates 106 are shown connected together in two rows and two columns in the array, additional package substrates 106 can be included and arranged in a strip with a single row and multiple columns of packages substrates 106, or multiple rows and columns. The strip or array of substrates 106 can correspond to the number and arrangement of substrates 108, or a different number and arrangement can be used. For example, multiple strips of substrate 108 having one row and multiple columns each can be used with an array containing multiple rows and columns of substrates 106, or vice versa. The overall number and position of substrates 106 will correspond to the overall number and position of substrates 108.

Each substrate 106 in FIG. 4 includes a recessed flag portion 118 comprised of extensions of lead fingers 120 spaced in a square or rectangle around an opening 137. Lead fingers 120 extend at a vertical angle (as shown in FIG. 1) from flag portion 118 and have an end opposite flag portion 118 connected to contacts 116, 117. Some lead fingers 120 may have a different length than others. A portion of lead fingers 120 can also be configured with a horizontal angle and/or a tapered profile to accommodate additional lead fingers 120. Vertical and horizontal tie bars 402, 404 are connected to contacts 116, 117 at one end of lead fingers 120 opposite opening 137. Opening 137 can be remain unfilled to accommodate a sensor die that requires access to an ambient parameter, such or pressure, or other type of die that requires an opening. Otherwise, opening 137 can be filled with encapsulant or insulating material to electrically isolate and protect lead fingers 120

Figure 5:
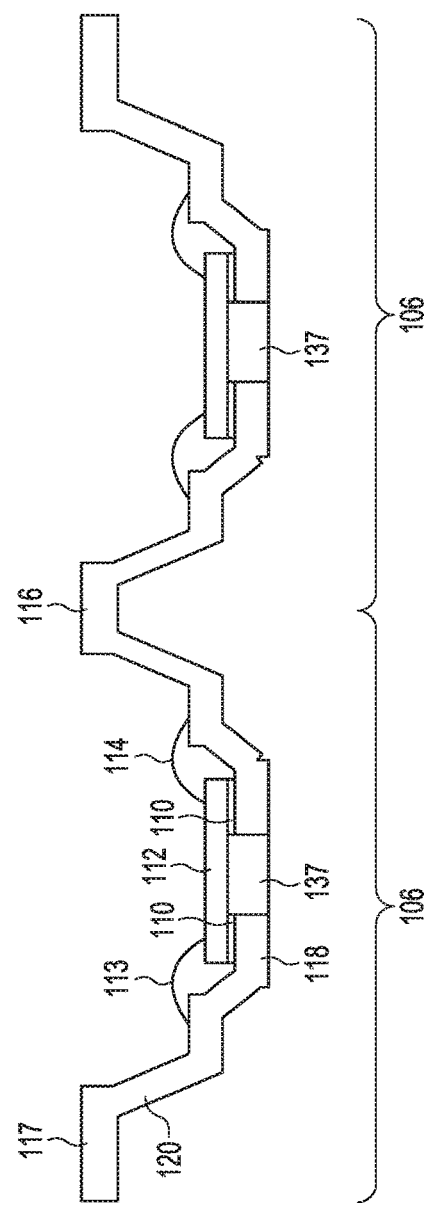
FIG. 5 shows a cross-sectional side view of an embodiment of the second package substrate of FIG. 4 at a subsequent stage of assembly.

FIG. 5 shows a cross-sectional side view of an embodiment of package substrates 106 of FIG. 4 at a subsequent stage of assembly in which die 112 is mounted to flag portion 118 by die attach material 110. Wirebonds 113, 114 are formed between respective contacts (not shown) on die 112 and contacts 118 on package substrates 106.

Figure 6:
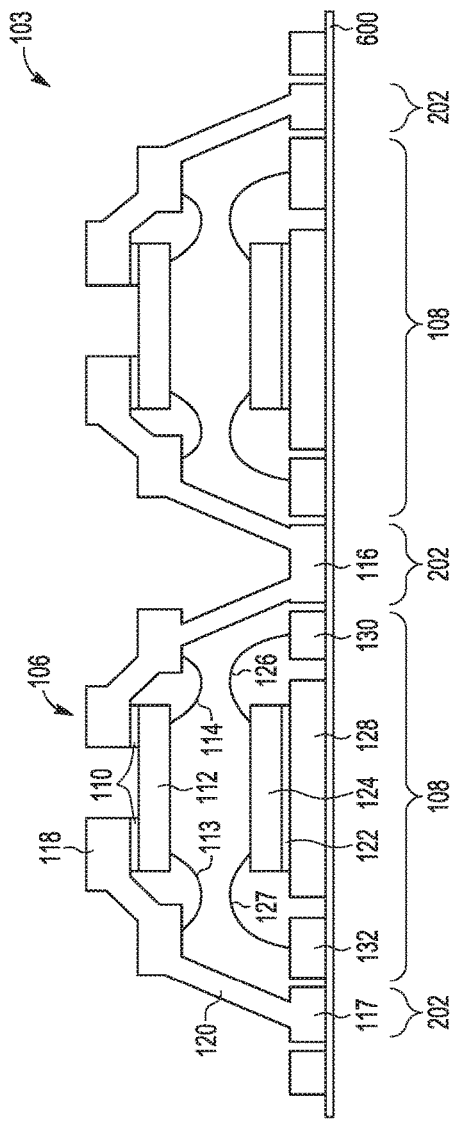
FIG. 6 shows a cross-sectional side view of the packaged semiconductor assembly 103 of FIG. 1 at an intermediate stage of manufacture.

FIG. 6 shows a cross-sectional side view of the packaged semiconductor assemblies 103 of FIG. 1 at an intermediate stage of manufacture in which package substrates 106 are placed upside-down over package substrates 108 after die 112, 124 have been attached and wirebonds 113, 114, 126, 127 are formed. Contacts 116, 117 of substrates 106 fit in slots 202 of package substrates 108. Die 112, 124 and wirebonds 113, 114, 126, 127 face one another in the configuration shown. Adhesive tape 600 holds package substrates 106, 108 in place during subsequent processing and singulation.

Figure 7:
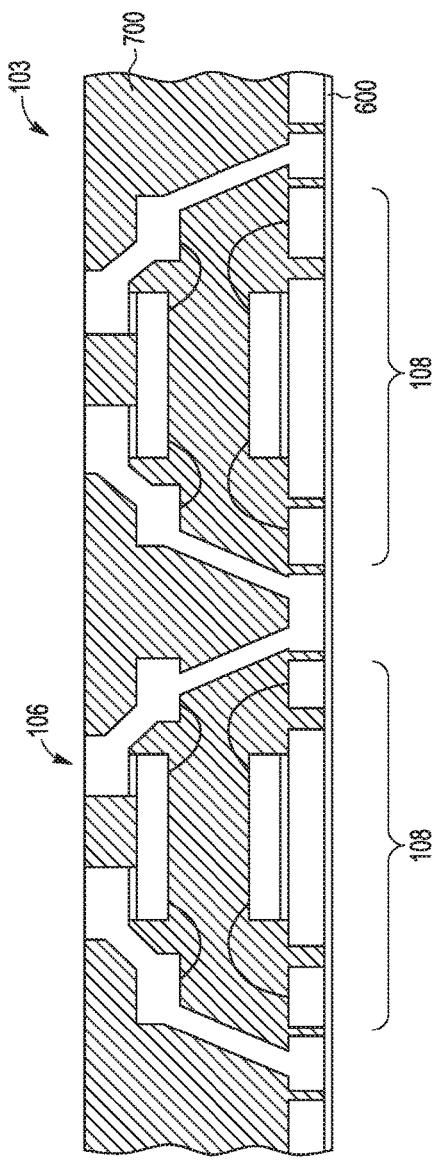
FIG. 7 shows a cross-sectional side view of the packaged semiconductor assembly 103 of FIG. 6 at a subsequent stage of manufacture.

FIG. 7 shows a cross-sectional side view of the packaged semiconductor assemblies 103 of FIG. 6 at a subsequent stage of manufacture during which package substrates 106, 108 and components mounted or bonded on package substrates are encased in encapsulant material 700. Examples of encapsulant material 700 include, but are not limited to, mold compound, epoxy, underfill, glob top, dam and fill, and the like. Encapsulant material 700 may be formed with film assisted injection molding, compression molding, and/or other suitable technique that provides a protective coating around package substrates 106, 108, die 112, 124, and wirebonds 113, 114, 126, 127. Tape 600 may remain in place during the molding process to help prevent the bottom surface of contacts 116, 117, 130, 132 from being covered with encapsulant material 700. Additionally, film, tape or other covering may be placed over the top of contacts 118 to prevent contacts 118 from being covered with encapsulant material 700. Alternatively, if film or tape is not used, encapsulating material 700 may be removed from the top of contacts 118 and the bottom of contacts 116, 117, 130, 132 by grinding or other suitable removal process.

Once encapsulant material 700 cures, the position of package substrate 106 is held in place relative to package substrate 108 by encapsulant material 700. Tape 600 may be removed once encapsulant material 700 is cured.

Figure 8:
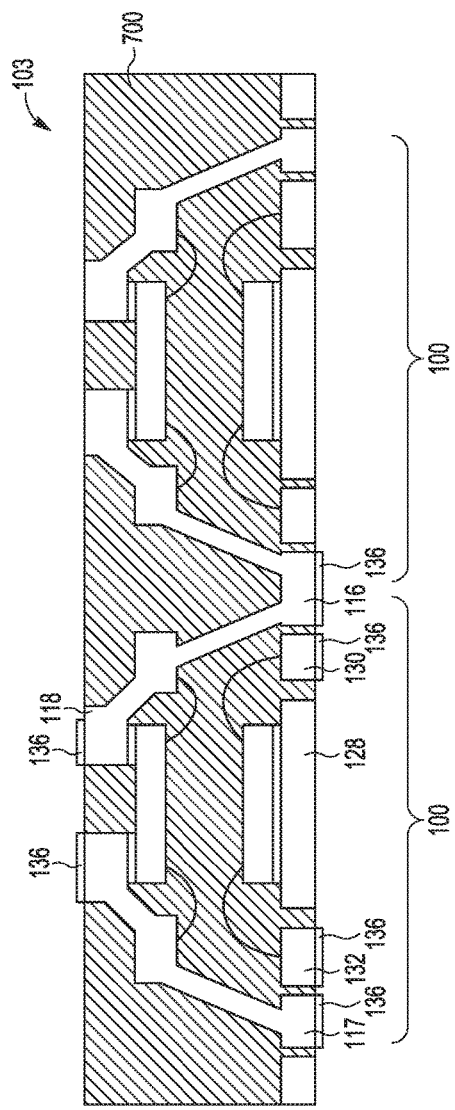
FIG. 8 shows a cross-sectional side view of the packaged semiconductor assembly 103 of FIG. 7 at a subsequent stage of manufacture.

FIG. 8 shows a cross-sectional side view of the packaged semiconductor assemblies 103 of FIG. 7 at a subsequent stage of manufacture in which additional conductive material 136 is patterned or plated on contacts 118, 116, 117, 130, 132. Conductive material 136 may be or include gold, copper, silver, tin, nickel, lead, or other suitable material. Any suitable electroplating or electroless plating technique or printing with conductive pastes can be used.

Figure 9:
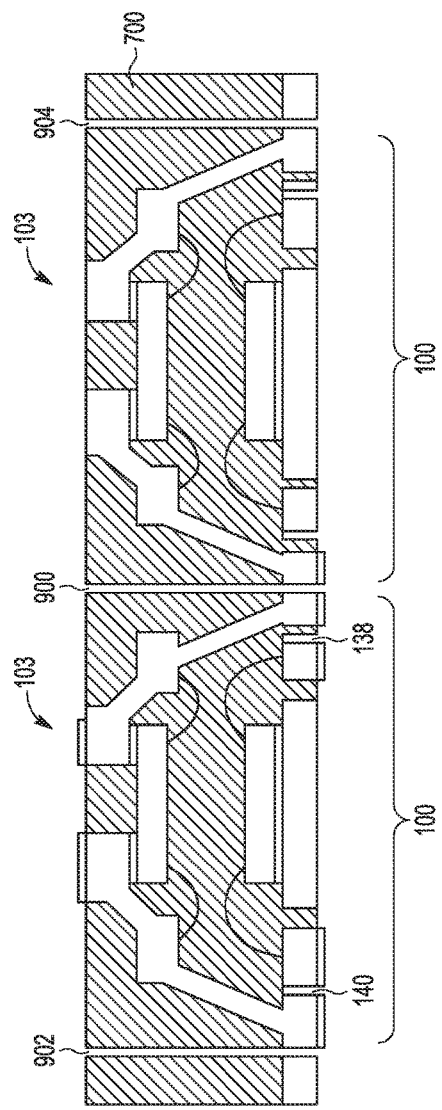
FIG. 9 shows a cross-sectional side view of the packaged semiconductor assembly 103 of FIG. 8 at a subsequent stage of manufacture.

FIG. 9 shows a cross-sectional side view of the packaged semiconductor assemblies 103 of FIG. 8 at a subsequent stage of manufacture in which packaged semiconductor assemblies 103 have been singulated into individual packaged semiconductor devices 103 including one of each of package substrates 106, 108, die 112, 124, wirebonds 113, 114, 126, 127, encapsulant material 700, and conductive material 136 over contacts 118, 116, 117, 130, 132. Singulation cuts 900, 902, 904 are made through contact 116, which previously connected adjacent package substrates 106, as well as through encapsulant material 700 to completely separate packaged semiconductor assemblies 103 from one another and to remove. Partial cuts 138, 140 are made to remove tie bars 204 (and 206) (FIG. 2) and a corresponding portion of conductive material 136, with the result that each of contacts 130, 132 are separated and electrically isolated from one another instead of having one end connected in common to a respective one of tie bars 204. Partial cuts 138, 140 extend into encapsulant material 700 a sufficient amount to insure contacts 130, 132 are separated and electrically isolated from one another, but do not extend further into encapsulant material 700 than necessary. A portion of conductive material 136 remains on contacts 130, 132 after singulation cuts 900, 902, 904 and partial cuts 138, 140 are made.

Figure 10:
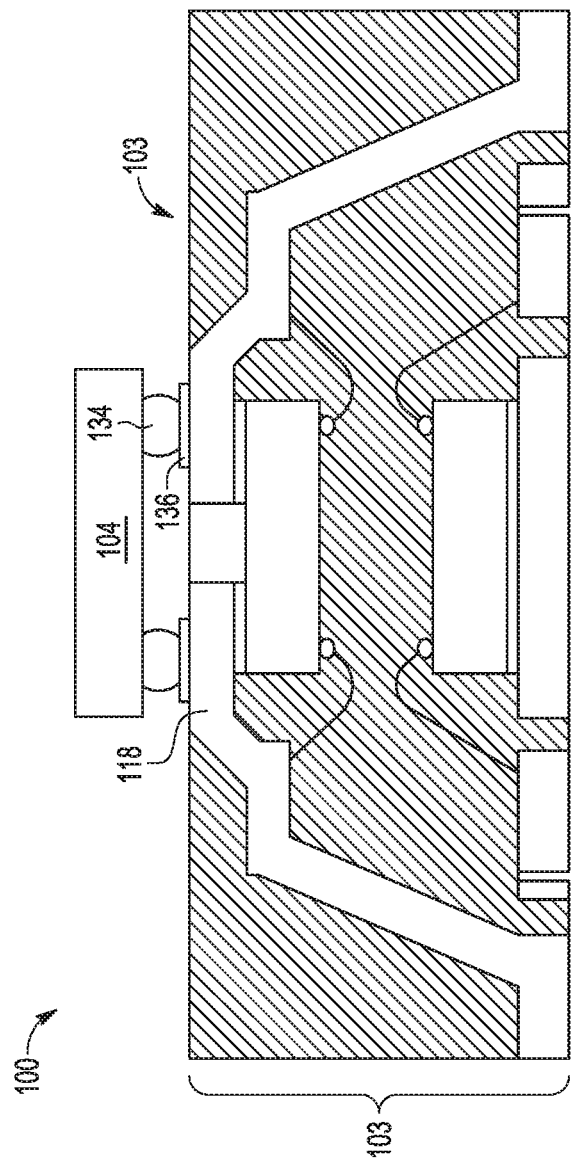
FIG. 10 shows a cross-sectional side view of the packaged semiconductor assembly 103 of FIG. 9 at a subsequent stage of manufacture.

FIG. 10 shows a cross-sectional side view of the packaged semiconductor assembly 103 of FIG. 9 at a subsequent stage of manufacture in which a packaged semiconductor device 104 is mounted to conductive material 136 on contacts 118. Packaged device 104 may include circuitry for any suitable or desired functionality such as a system on a chip with a processor, memory device and sensor, or a standalone processor, memory device, or sensor, or any combination thereof.

Figure 11:
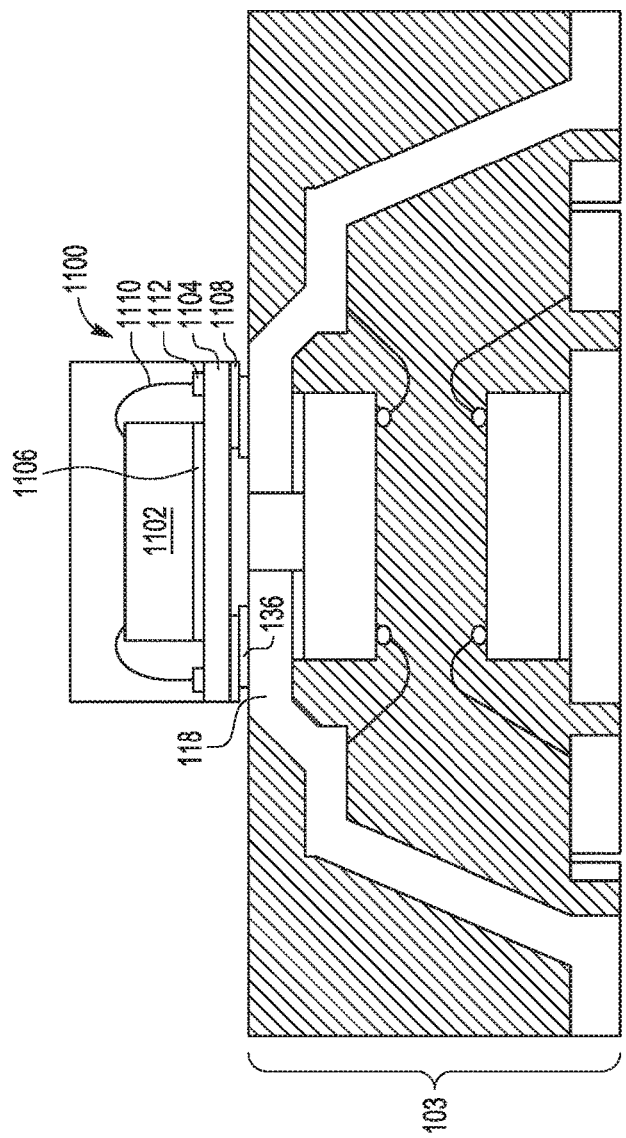
FIG. 11 shows a side cross-sectional view of an embodiment of another packaged semiconductor device stacked on the packaged semiconductor assembly of FIG. 10.

In the embodiment shown, packaged device 104 is mounted with electrically conductive solder balls 134 coupled to conductive material 136 on assembly 103, however other suitable types of packaged devices 104 and techniques for mounting packaged device to electrically communicate with assembly 103 can be used. As an example, FIG. 11 shows a side cross-sectional view of an embodiment of a packaged semiconductor device 1100 stacked on packaged semiconductor assembly 103. Packaged semiconductor device 1100 is a land grid array package with die 1102 mounted to a top surface of substrate 1104 with die attach material 1106, and wirebonds 1110 between contacts on die 1102 and contacts 1112 on substrate 1104. Additional contacts 1108 are included on a bottom surface of substrate 1104 and are used to attach packaged semiconductor device 1100 to contacts 136 on packaged semiconductor assembly 103. A greater number of contacts 1108 than actually needed can be arranged in a pattern, such as a rectangular, circular, or other suitably shaped pattern to enable device 1100 to be easily attached to contacts 136 in various positions on substrate 1104. That is, the position of contacts 136 may vary depending on the size and shape of packaged semiconductor assembly 103, but different contacts 1108 on packaged semiconductor device 1100 can be used to accommodate the variation, if any.

Figure 12:
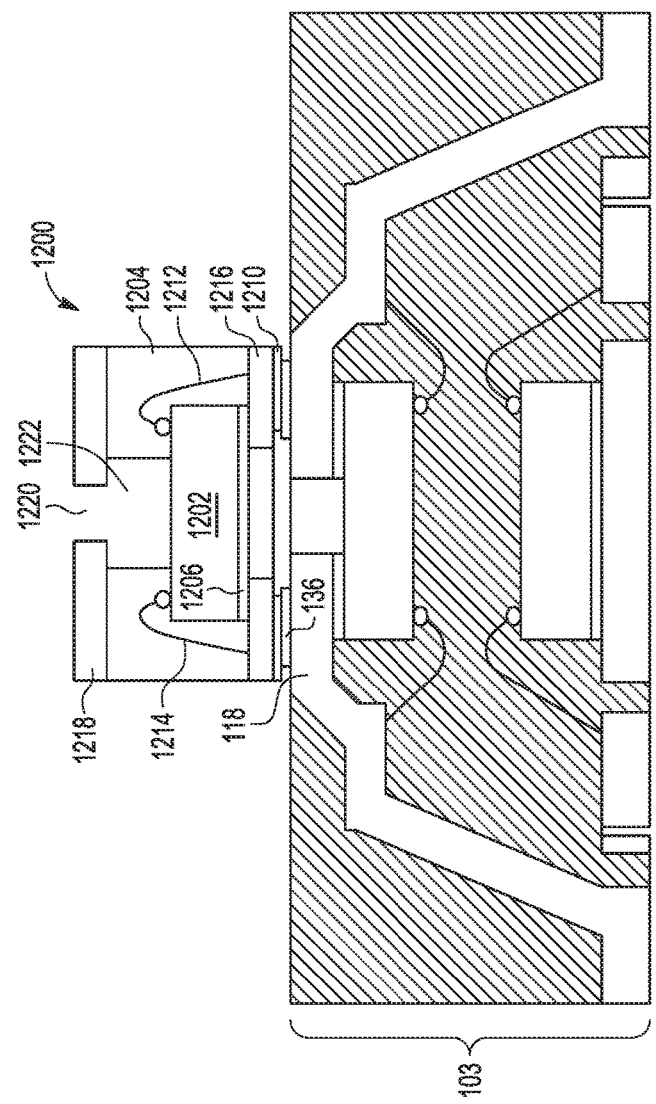
FIG. 12 shows a side cross-sectional view of an embodiment of a microelectrical-mechanical system (MEMS) sensor device stacked on the packaged semiconductor assembly of FIG. 10.

As another example of a packaged device that can be mounted to electrically communicate with assembly 103, FIG. 12 shows a side cross-sectional view of an embodiment of a microelectrical-mechanical system (MEMS) sensor device 1200 stacked on packaged semiconductor assembly 103 including die 1202 mounted to a top surface of substrate 1206 with die attach material (not shown), and wirebonds 1212, 1214 between contacts on die 1202 and contacts 1216 on substrate 1206. Sensor device 1200 may be configured as any suitable type or types of sensor. For example, sensor device 1200 may be a pressure sensor, accelerometer, gyroscope, and/or temperature sensor, among others. Encapsulant material 1204 encases wirebonds 1212, 1214, substrate 1206, and side and bottom portions of die 1202, while a portion of an upper surface of die 1202 remains uncovered and open to ambient environment of cavity 1222. A lid or cover 1218 is attached or mounted to a top surface of encapsulant material 1204 with an opening 1220 over cavity 1222 to allow a diaphragm or membrane (not shown) on die 1202 to deflect according to ambient pressure in cavity 1222. The deflection is sensed and translated to a corresponding pressure reading that may be provided to assembly 103 or other component external to assembly 103. Note that cavity 1222 and opening 1220 in lid 1218, and even lid 1218 itself, may not be required depending on the type of sensor(s) included in device 1200. Contacts 1216 are included on a bottom surface of substrate 1206 and are used to attach packaged semiconductor device 1200 to contacts 136 on packaged semiconductor assembly 103 with conductive material 1210, such as solder, conductive adhesive, or other suitable material, while allowing die 1202 to electrically communicate with die 112 and/or die 124.

Figure 13:
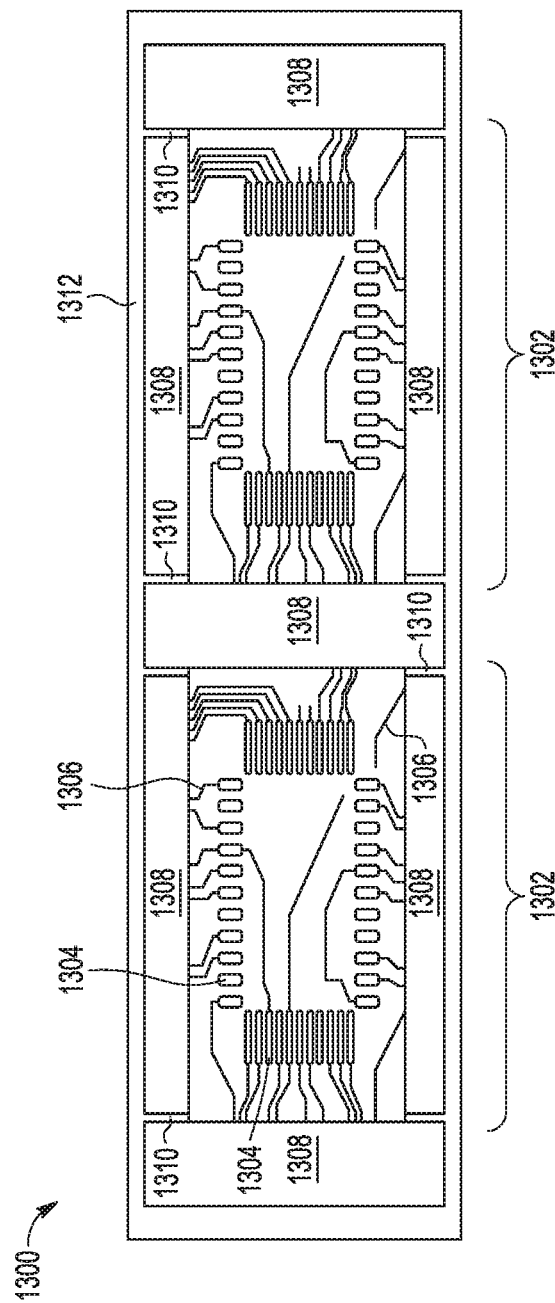
FIG. 13 shows a top view of an embodiment of another type of package substrates that can be used in the packaged semiconductor assemblies of FIGS. 1, 11 and 12.

FIG. 13 shows a top view of an embodiment of another type of package substrates 1302 that can be used in the packaged semiconductor assemblies 103 of FIGS. 1, 11 and 12. Package substrates 1302 are referred to as laminate ball grid array (BGA) substrates and can be made of plastic, ceramic or metal material with an array of solder contacts on a bottom surface and electrical contacts 1304 and routing traces 1306 on the top surface. Package substrates 1302 are arranged in a strip 1300 that includes two package substrates 1302 connected to vertical and horizontal tie bars 1310 that retain package substrates 1302 in strip 1300 until substrates 1302 are singulated. Note that substrate strip 1300 can include additional package substrates 1302 arranged in a row, or as a two dimensional array with two or more package substrates 1302 in each row and column. Each package substrate 1302 is square or rectangular with contacts 1304 spaced separately from each around the periphery of a central portion where a die (not shown) may be mounted on and bonded to one end of contacts 1304. Tie bars 1310 are in turn coupled to frame 1312. Slots or openings 1308 are positioned between vertical tie bars 1310 to accommodate contacts 117, 116 of package substrate 106 (not shown) at a subsequent stage of manufacture.

By now it should be appreciated that in some embodiments, there has been provided a packaged semiconductor device (100) that can comprise a first package substrate (108) having a first plurality of lead fingers (130, 132); a first die (124) attached to a first major surface of the first package substrate; a first plurality of interconnects (127) coupled between the first plurality of lead fingers and the first die; and a second package substrate (106) having a second plurality of lead fingers (120). Each of the second plurality of lead fingers can extend over the first die and the second package substrate can be electrically isolated from the first package substrate. A second die (112) can be attached to a first major surface of the second package substrate, over the first die. A second plurality of interconnects (113) can be coupled between the second plurality of lead fingers and the second die. An encapsulant (102) can surround the first die, the first package substrate, the second die, and the second package substrate. The encapsulant can expose a portion (132, 130) of the first package substrate and a portion (117 or 118) of the second package substrate.

In another aspect, the portion of the first package substrate is exposed at a first major surface of the packaged semiconductor device and the portion of the second package substrate comprises package contacts (117) exposed at the first major surface of the packaged semiconductor device.

In another aspect, the encapsulant can expose a second portion (118) of the second package substrate at a second major surface of the packaged semiconductor device, opposite the first major surface of the packaged semiconductor device.

In another aspect, the second plurality of lead fingers can be bent so as to extend from the first major surface to the second major surface of the packaged semiconductor device.

In another aspect, the first package substrate can be at the first major surface of the packaged semiconductor device.

In another aspect, the packaged semiconductor device can further comprise a second packaged semiconductor device (104) attached to the second exposed portion of the second package substrate.

In another aspect, the first plurality of interconnects and the second plurality of interconnects can comprise wire bonds.

In another aspect, the wire bonds can be completely surrounded by the encapsulant.

In another aspect, the first major surface of the first package substrate can face the first major surface of the second package substrate such that the first die and the second die are between the first major surface of the first package substrate and the first major surface of the second package substrate and are completely surrounded by the encapsulant.

In another aspect, the first package substrate can comprise a lead frame.

In another aspect, the first plurality of lead fingers can be separated from each other by a partial cut (140, 138).

In another aspect, the first package substrate can comprise a laminate substrate.

In another embodiment, a method for forming a packaged semiconductor device can comprise attaching a first die (124) onto a first major surface of a first package substrate (108) having a first plurality of lead fingers (130); and attaching a second die (112) onto a first major surface of second package substrate (106) having a second plurality of lead fingers. The second die can be attached to a downset flag portion (118) of the second package substrate and the second plurality of lead fingers can extend from the flag portion to package contacts (118) above the second die. The second package substrate is inverted over the first package substrate such that the second die is over the first die, the first major surface of the first package substrate faces the first major surface of the second package substrate, and the package contacts are coplanar with the first plurality of lead fingers. The first die, the first package substrate, the second die, and the second package substrate can be encapsulated by an encapsulant that exposes a portion of the first package substrate and the package contacts at a first major surface of the packaged semiconductor device.

In another aspect, forming the encapsulant is performed such that a portion of the second package substrate is exposed by the encapsulant at a second major surface of the packaged semiconductor device opposite the first major surface.

In another aspect, the method can further comprise performing a full cut (900) through the encapsulant to singulate the first and second die wherein the first and second die together are included in the packaged semiconductor device.

In another aspect, the first package substrate comprises a lead frame, and wherein, prior to the performing the full cut, performing a partial cut (140) to separate the first plurality of lead fingers from each other.

In another aspect, the method can further comprise placing the first package substrate on a carrier. Inverting the second package substrate over the first package substrate can comprise placing the inverted second package substrate on the carrier, wherein the package contacts of the inverted second package substrate are spaced apart from the first package substrate on the carrier.

In another aspect, the method can further comprise attaching a second packaged semiconductor substrate to the exposed portion of the second package substrate.

In still another embodiment, a packaged semiconductor device can comprise a first package substrate comprising a lead frame and a first plurality of lead fingers; a first die attached to the first package substrate; a first set of wire bonds coupled between the first plurality of lead fingers and the first die; and a second package substrate comprising a lead frame and having a second plurality of lead fingers. Each of the second plurality of lead fingers can include a package contact and extends over the first die, and the second package substrate can be electrically isolated from the first package substrate. A second die can be attached to the second package substrate, over the first die. A second set of wire bonds can be coupled between the second plurality of lead fingers and the second die. An encapsulant can surround the first die, the first package substrate, the first set of wire bonds, the second die, the second set of wire bonds, and the second package substrate. The encapsulant exposes a portion of the first package substrate and package contacts of the second package substrate at a first major surface of the packaged semiconductor device, and a portion of the second package substrate at a second major surface of the packaged semiconductor device, opposite the first major surface of the packaged semiconductor device. The second plurality of lead fingers can be bent so as to extend from the first major surface to the second major surface of the packaged semiconductor device.

In another aspect, the first plurality of lead fingers are separated from each other by a partial cut.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for making a packaged semiconductor device comprising:
    attaching a first die to a first major surface of a first package substrate;
    forming a first plurality of interconnects between a first plurality of lead fingers and the first die;
    attaching a second die to a first major surface of a second package substrate, over the first die, wherein the second package substrate has a second plurality of lead fingers that extend over the first die and the second package substrate is electrically isolated from the first package substrate;
    forming a second plurality of interconnects between the second plurality of lead fingers and the second die; and
    after the second plurality of interconnects are formed, using a single encapsulating process to simultaneously encapsulate the first die, the first package substrate, the second die, the second package substrate, and the first and second plurality of interconnects with an encapsulant, wherein the encapsulant
        exposes a portion of the first package substrate and a portion of the second package substrate, and
        is in direct contact with the first and second die and the first and second plurality of interconnects.

2. The method of claim 1, wherein the portion of the first package substrate is exposed at a first major surface of the packaged semiconductor device and the portion of the second package substrate comprises package contacts exposed at the first major surface of the packaged semiconductor device.

3. The method of claim 2, wherein the encapsulant exposes a second portion of the second package substrate at a second major surface of the packaged semiconductor device, opposite the first major surface of the packaged semiconductor device.

4. The method of claim 3, wherein the second plurality of lead fingers are bent so as to extend from the first major surface to the second major surface of the packaged semiconductor device.

5. The method of claim 3, wherein the first package substrate is at the first major surface of the packaged semiconductor device.

6. The method of claim 3, further comprising a second packaged semiconductor device attached to the second exposed portion of the second package substrate.

7. The method of claim 1, wherein the first plurality of interconnects and the second plurality of interconnects comprise wire bonds.

8. The method of claim 7, wherein the wire bonds are completely surrounded by the encapsulant.

9. The method of claim 1, wherein the first major surface of the first package substrate faces the first major surface of the second package substrate such that the first die and the second die are between the first major surface of the first package substrate and the first major surface of the second package substrate and are completely surrounded by the encapsulant.

10. The method of claim 1, wherein the first package substrate comprises a lead frame.

11. The method of claim 10, wherein the first plurality of lead fingers are separated from each other by a partial cut.

12. The method of claim 1, where the first package substrate comprises a laminate substrate.

13. A method for forming a packaged semiconductor device, comprising:
    attaching a first unencapsulated die onto a first major surface of a first package substrate having a first plurality of lead fingers;
    attaching a second unencapsulated die onto a first major surface of a second package substrate having a second plurality of lead fingers, wherein the second die is attached to a downset flag portion on a first plane of the second package substrate and a portion of at least some of the second plurality of lead fingers extend at an angle directly from the flag portion to package contacts above the second die;
    inverting the second package substrate over the first package substrate such that the second die is over the first die, the first major surface of the first package substrate faces the first major surface of the second package substrate, and the package contacts are coplanar with the first plurality of lead fingers; and
    after inverting the second package substrate over the first package substrate, encapsulating the first die, the first package substrate, the second die, and the second package substrate, wherein encapsulating comprises forming an encapsulant that exposes a portion of the first package substrate and the package contacts at a first major surface of the packaged semiconductor device.

14. The method of claim 13, wherein forming the encapsulant is performed such that a portion of the second package substrate is exposed by the encapsulant at a second major surface of the packaged semiconductor device opposite the first major surface.

15. The method of claim 13, further comprising:
performing a full cut through the encapsulant to singulate the first and second die wherein the first and second die together are included in the packaged semiconductor device.

16. The method of claim 15, wherein the first package substrate comprises a lead frame, and wherein, prior to the performing the full cut, performing a partial cut to separate the first plurality of lead fingers from each other.

17. The method of claim 13, further comprising placing the first package substrate on a carrier, wherein inverting the second package substrate over the first package substrate comprises placing the inverted second package substrate on the carrier, wherein the package contacts of the inverted second package substrate are spaced apart from the first package substrate on the carrier.

18. The method of claim 13, further comprising attaching a second packaged semiconductor substrate to the exposed portion of the second package substrate.

19. A method of making a packaged semiconductor device comprising:
attaching a first die to a first package substrate, wherein the first package substrate comprises a lead frame and a first plurality of lead fingers;
forming a first set of wire bonds between the first plurality of lead fingers and the first die;
attaching a second die to a second package substrate, over the first die, wherein the second package substrate comprises a lead frame and has a second plurality of lead fingers, each of the second plurality of lead fingers includes a package contact and extends over the first die, and the second package substrate is electrically isolated from the first package substrate;
forming a second set of wire bonds between the second plurality of lead fingers and the second die; and
after forming the second set of wire bonds, forming a single encapsulant in direct contact with the first die, the first package substrate, the first set of wire bonds, the second die, the second set of wire bonds, and the second package substrate, wherein the encapsulant exposes a portion of the first package substrate and package contacts of the second package substrate at a first major surface of the packaged semiconductor device, and a portion of the second package substrate at a second major surface of the packaged semiconductor device, opposite the first major surface of the packaged semiconductor device, and wherein the second plurality of lead fingers are bent so as to extend from the first major surface to the second major surface of the packaged semiconductor device.

20. The method of claim 19, wherein the first plurality of lead fingers are separated from each other by a partial cut.

* * * * *